US009625215B2

(12) United States Patent  
Hsiao

(10) Patent No.: US 9,625,215 B2  
(45) Date of Patent: Apr. 18, 2017

(54) ELECTRONIC DEVICE AND HEAT DISSIPATION PLATE

(71) Applicant: HTC Corporation, Taoyuan (TW)

(72) Inventor: Ya-Lin Hsiao, Taoyuan (TW)

(73) Assignee: HTC Corporation, Taoyuan (TW)

(*) Notice: Subject to any disclaimer, the term of this patent is extended or adjusted under 35 U.S.C. 154(b) by 0 days.

(21) Appl. No.: 14/850,964

(22) Filed: Sep. 11, 2015

(65) Prior Publication Data

US 2016/0088769 A1 Mar. 24, 2016

Related U.S. Application Data

(60) Provisional application No. 62/053,201, filed on Sep. 21, 2014.

(51) Int. Cl.  
H05K 7/20 (2006.01)  
F28D 15/02 (2006.01)  
G06F 1/20 (2006.01)  
F28D 15/04 (2006.01)  
H05K 1/02 (2006.01)

(52) U.S. Cl.  
CPC ..... *F28D 15/0275* (2013.01); *F28D 15/0233* (2013.01); *F28D 15/04* (2013.01); *G06F 1/20* (2013.01); *F28D 2015/0216* (2013.01); *H05K 1/0203* (2013.01); *H05K 2201/064* (2013.01)

(58) Field of Classification Search  
CPC .............. F28D 15/0275; G06F 1/203

USPC .......... 361/679.52, 679.53, 679.56  
See application file for complete search history.

(56) References Cited

U.S. PATENT DOCUMENTS

| | | |
|---|---|---|
| 6,418,017 B1 | 7/2002 | Patel et al. |
| 7,124,507 B1 | 10/2006 | Andraka et al. |
| 7,188,484 B2 | 3/2007 | Kim |
| 7,898,798 B2 | 3/2011 | Sakata et al. |
| 8,159,819 B2 * | 4/2012 | Memon ............. G06F 1/20 165/185 |
| 8,305,761 B2 * | 11/2012 | Degner ........... H01L 23/4006 165/104.33 |
| 8,693,186 B2 | 4/2014 | Wu |
| 2004/0011512 A1 * | 1/2004 | Noda ............... F28D 15/046 165/104.26 |
| 2009/0323276 A1 * | 12/2009 | Mongia ............. G06F 1/203 361/679.52 |

* cited by examiner

*Primary Examiner* — Tuan T Dinh  
*Assistant Examiner* — Mukund G Patel  
(74) *Attorney, Agent, or Firm* — Jianq Chyun IP Office

(57) ABSTRACT

An electronic device and a heat dissipation plate are provided. The electronic device includes a frame or a housing, a first heat generating component, a second heat generating component and a heat pipe, and the heat dissipation plate includes the frame and the heat pipe. The heat pipe is installed at the frame or housing and has branches. An orthogonal projection of the heat pipe on the frame or the housing overlaps at least part of orthogonal projections of the first heat generating component and the second heat generating component on the frame or the housing.

11 Claims, 7 Drawing Sheets

ELECTRONIC DEVICE AND HEAT DISSIPATION PLATE

CROSS-REFERENCE TO RELATED APPLICATION

This application claims the priority benefits of U.S. provisional application Ser. No. 62/053,201, filed on Sep. 21, 2014. The entirety of the above-mentioned patent application is hereby incorporated by reference herein and made a part of this specification.

BACKGROUND

Field of the Invention

The invention is directed to an electronic device and a heat dissipation plate, and more particularly, to an electronic device having a heat pipe and a heat dissipation plate.

Description of Related Art

In recent years, with the advance of technology industries, information products, such as electronic devices including notebook computers, tablet computers and smart phones have appeared frequently in everyday lives. Types and functions of the electronic devices have become increasingly diverse, and convenience and practicality of these electronic device result in popularity thereof.

Generally, a frame is disposed in an electronic device to provide a supporting force required by the electronic device. In order to achieve sufficient strength of the frame, the frame is usually manufactured by using a metal material, such as stainless steel. On the other hand, a central processing unit (CPU), a processing chip, or other electronic components are installed in the electronic device, and these electronic components generate heat when being in operation. Besides the supporting capability, the frame may further guide the heat to facilitate in the dissipation of the electronic device. However the stainless steel with better strength has an issue of having a small thermal conductivity coefficient, and as a result, the heat cannot effectively conducted and dissipated, which the operational performance of the electronic device will be seriously affected.

SUMMARY

The invention is directed to an electronic device and a heat dissipation plate, which can contribute to solve the issue of poor dissipation efficiency in the related art.

According to an embodiment of the invention, an electronic device including a frame or a housing, a first heat generating component, a second heat generating component and a heat pipe is provided. The heat pipe is installed at the frame or the housing and has branches. An orthogonal projection of the heat pipe on the frame or the housing at least partially overlaps orthogonal projections of the first heat generating component and second heat generating component on the frame or the housing.

According to an embodiment of the invention, a heat dissipation plate adaptive for a circuit board of an electronic device is provided. The circuit board has a first heat generating component and a second heat generating component. The heat dissipation plate includes a frame and a heat pipe. The frame is assembled to the circuit board and has an opening or a notch. The heat pipe installed at the frame and embedded in the opening or the notch. The heat pipe has branches, and an orthogonal projection of the heat pipe on the frame at least partially overlaps orthogonal projections of the first heat generating component and second heat generating component on the frame.

According to an embodiment of the invention, a heat dissipation plate adaptive for a circuit board of an electronic device is provided. The circuit board has a first heat generating component and a second heat generating component. The heat dissipation plate includes a housing and a heat pipe. The heat pipe is installed on the housing. The heat pipe has branches, and an orthogonal projection of the heat pipe on the housing at least partially overlaps orthogonal projections of the first heat generating component and second heat generating component on the housing.

Based on the above, in the electronic device and the heat dissipation plate of the invention, the branched heat pipe is installed at the frame or the housing. Thereby, the heat pipe may guide heat from a plurality of heat generating components to a low-temperature place, such that the electronic device can have a good heat dissipation effect.

In order to make the aforementioned and other features and advantages of the invention more comprehensible, several embodiments accompanied with figures are described in detail below.

DESCRIPTION OF EMBODIMENTS

Figure 1:
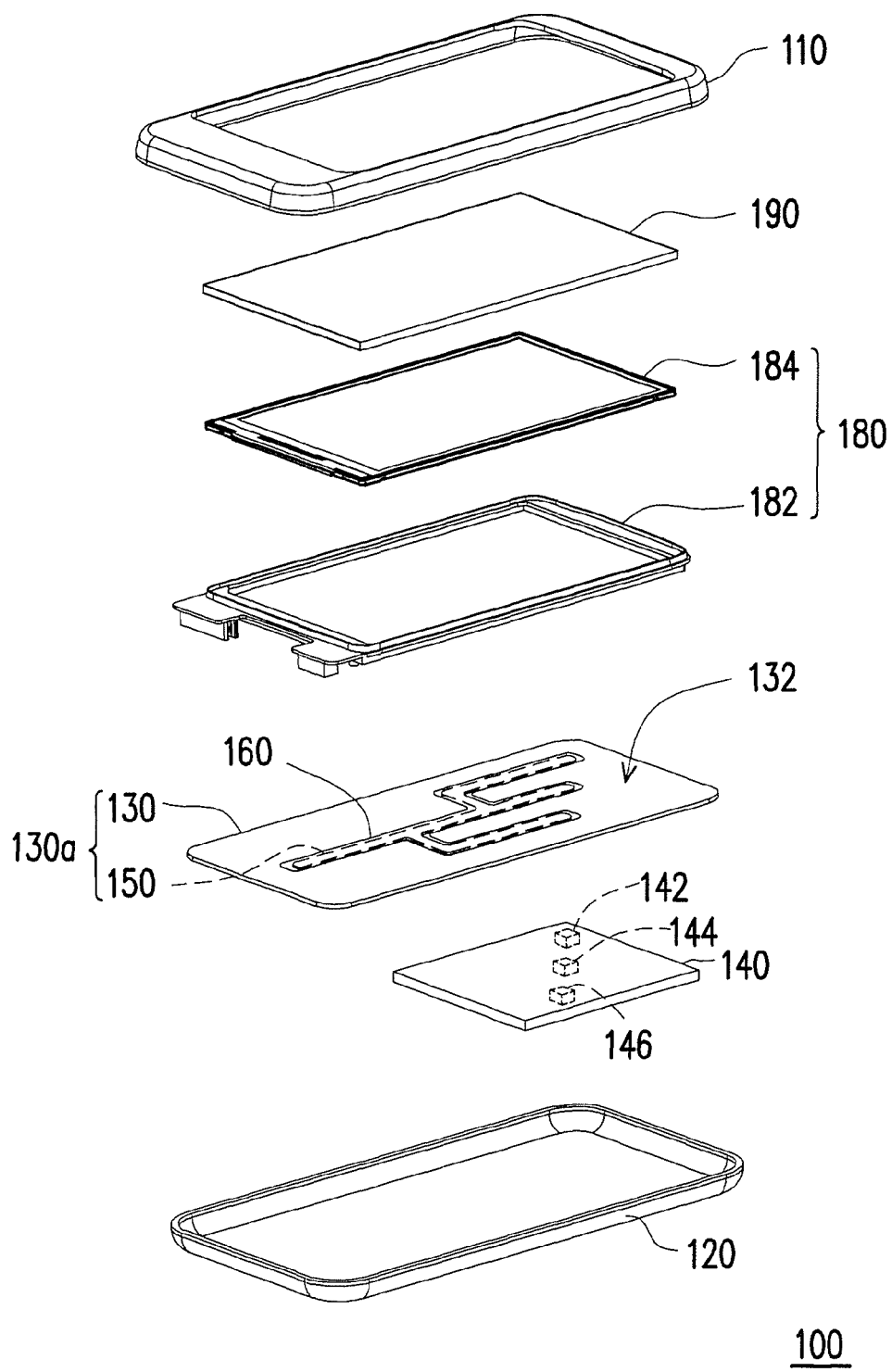
FIG. 1 is a schematic exploded diagram illustrating an electronic device according to an embodiment of the invention.

FIG. 1 is a schematic exploded diagram illustrating an electronic device according to an embodiment of the invention. Referring to FIG. 1, in the present embodiment, an electronic device 100 includes a front cover 110, a back cover 120, a frame 130, a circuit board 140 and a heat pipe 150. A combination of the frame 130 and the heat pipe 150 forms a heat dissipation plate 130a, and the front cover 110 and the back cover 120 forms a housing of the electronic device 100. The frame 130 is assembled between the front cover 110 and the back cover 120. The circuit board 140 is assembled between the frame 130 and the back cover 120 and has a first heat generating component 142, a second heat generating component 144 and a third heat generating component 146.

Figure 2:
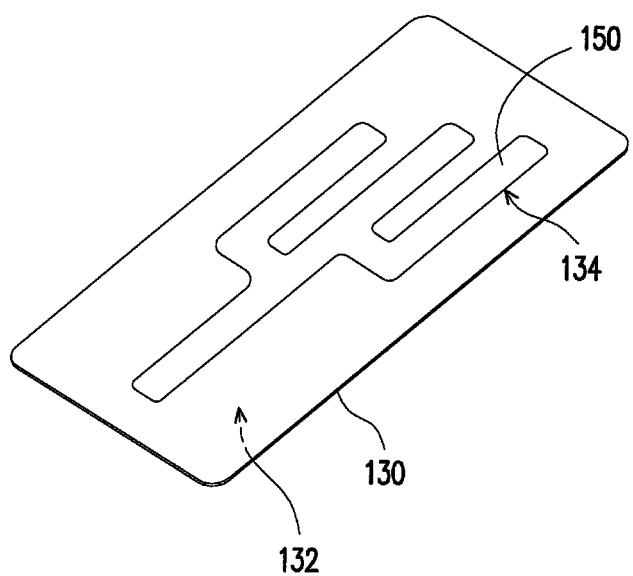
FIG. 2 is a schematic diagram illustrating the heat dissipation plate depicted in FIG. 1 in another viewing angle.

FIG. 2 is a schematic diagram illustrating the heat dissipation plate depicted in FIG. 1 in another viewing angle. It should be noted that for clear view, the viewing angle of FIG. 2 is different from the viewing angle of FIG. 1. Referring to FIG. 1 and FIG. 2, the frame 130 of the present embodiment has an opening 134, and through an adaptive manufacturing process, the heat pipe 150 may be embedded in the opening 134 of the frame 130. For instance, after the heat pipe 150 is embedded in the opening 134 of the frame 130, the heat pipe 150 and the frame 130 may be bonded to each other by means of a solder material used for soldering. Additionally, with the design of the frame 130 having the opening 134, an overall thickness after the frame 130 is bonded to the heat pipe 150 may be reduced. Thereby, the demand for thinning the electronic device 100 may be satisfied. Basically, a shape of the opening 134 is consistent with a shape of the heat pipe 150 in the present embodiment. Additionally, the electronic device 100 may further include a fixing plate 160 capable of bonding the heat pipe 150 to the frame 130. The heat pipe 150 may be assembled in advance to the fixing plate 160 and the heat pipe 150 assembled to the fixing plate 160 is then embedded in the opening 134 to be bonded with the frame 130. In this way, assembly convenience and reliability of the electronic device 100 may be enhanced. A thermal conductive adhesive (not shown) may be disposed between the frame 130 and the fixing plate 160 and between the heat pipe 150 and the fixing plate 160. The heat from the first heat generating component 142, the second heat generating component 144 and the third heat generating component 146 may be transmitted to the heat pipe 150 through heat conduction by the thermal conductive adhesive, such that the heat from the first heat generating component 142, the second heat generating component 144 and the third heat generating component 146 may be quickly taken away, and a thermal resistance may be prevented from generating due to the air existing between the frame 130 and the fixing plate 160.

Figure 3:
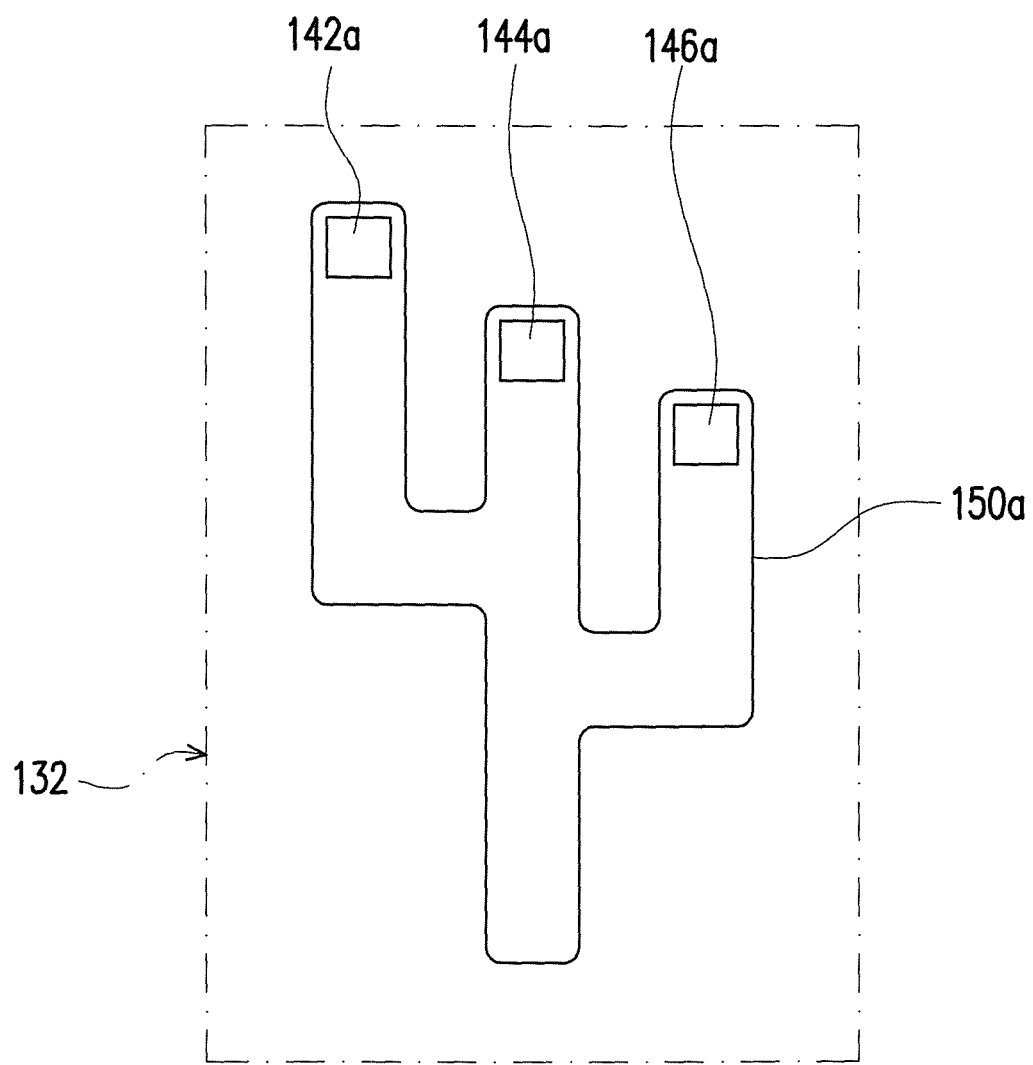
FIG. 3 is an orthogonal projection diagram illustrating the heat pipe and the heat generating components on the frame depicted in FIG. 1.

FIG. 3 is an orthogonal projection diagram illustrating the heat pipe and the heat generating components on the frame depicted in FIG. 1. Referring to FIG. 1 and FIG. 3, the heat pipe 150 is installed at the frame 130 and the heat pipe 150 in a branched shape. In other words, the heat pipe 150 has a plurality of branches. A round chamfer angle may be selectively disposed at a connection between each branch of the branched heat pipe 150. An orthogonal projection 150a of the heat pipe 150 on a surface 132 of the frame 130 at least partially overlaps orthogonal projections 142a, 144a and 146a of the first heat generating component 142, the second heat generating component 144 and the third heat generating component 146 on the surface 132 of the frame 130. To be detailed, the orthogonal projection 150a of the heat pipe 150 overlapping the orthogonal projections 142a, 144a and 46a represents that a position of the heat pipe 150 is located on a path passing the first heat generating component 142, the second heat generating component 144 and the third heat generating component 146 of the circuit board 140. When the first heat generating component 142, the second heat generating component 144 and the third heat generating component 146 are in operation and generate the heat, the heat pipe 150 may effectively dissipate the heat through guiding the heat to a low-temperature place, such that the electronic device 100 is provided with a good heat dissipation effect. With the heat pipe 150 taking away the heat of the components generating the heat, the electronic device 100 is provided with the good heat dissipation effect and maintained at stable efficiency.

In addition, the frame 130 may be made of a material with sufficient strength, such as stainless steel to provide supporting force required by the electronic device 100. Thus, not only the branched heat pipe 150 may be used for dissipation management of the plurality of heat generating components, but also the area may be reserved to the most for the frame 130 providing the supporting force, so as to achieve both heat dissipation efficiency and structural strength.

The first heat generating component 142, the second heat generating component 144 and the third heat generating component 146 of the circuit board 140 of the present embodiment may be the electronic components generating high heat, for example, selected from a front lens image chip, a central processing unit (CPU), a primary lens image chip, a charging chip, a power management chip and a radio frequency (RF) chip. In this case, the electronic device 100 disposed with three heat generating components is illustrated for example; however, the invention may also be applied to an electronic device having two or more heat generating components.

Referring to FIG. 1 again, the electronic device 100 of the present embodiment further includes a display module 180 disposed between the frame 130 and the front cover 110. Additionally, the display module 180 may be formed by a frame 182 and a display panel 184, and the frame 182 carries the display panel 184. With the disposition, the electronic device 100 may be provided with a display function. In addition, the electronic device 100 may further include a touch module 190 disposed on the display module 180, and the display module 180 and the touch module 190 are assembled together by using an optical adhesive (not shown). Thereby, the electronic device 100 may be provided with a display and a touch control functions. Alternatively, the display module 180 may also be integrated with a touch function.

Figure 4:
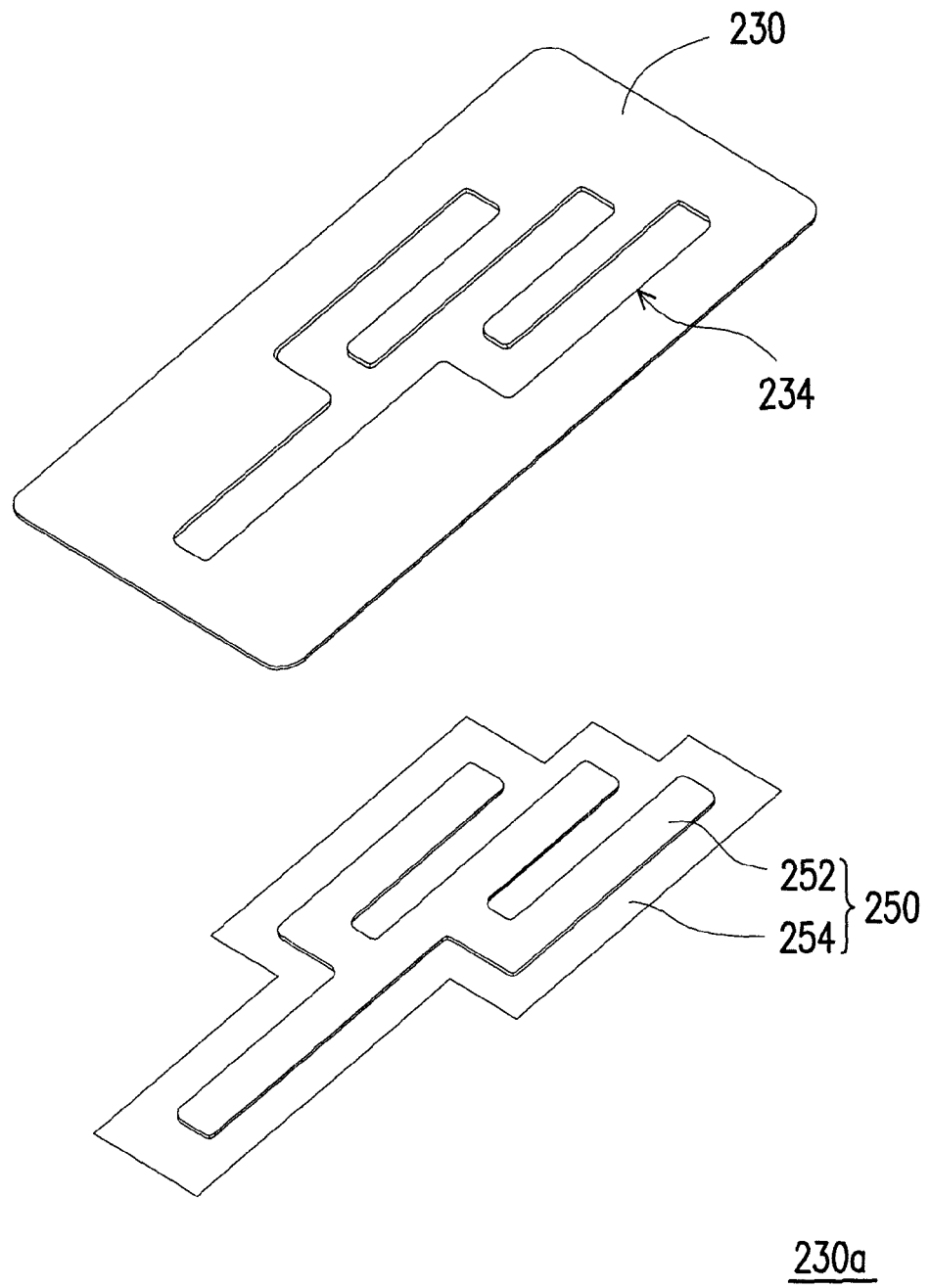
FIG. 4 is a schematic exploded diagram illustrating a heat dissipation plate according to an embodiment of the invention.
Figure 5:
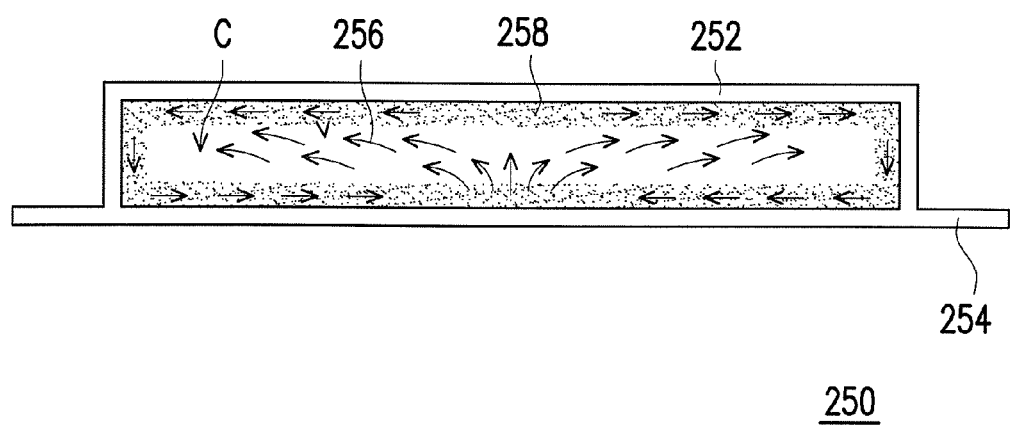
FIG. 5 is a schematic sectional diagram illustrating the heat dissipation plate depicted in FIG. 4.

FIG. 4 is a schematic exploded diagram illustrating a heat dissipation plate according to an embodiment of the invention. FIG. 5 is a schematic sectional diagram illustrating the heat dissipation plate depicted in FIG. 4. Referring to FIG. 4 and FIG. 5, in the present embodiment, the heat pipe 250 of the heat dissipation plate 230a includes a pipy portion 252 and a bottom portion 254. After the heat pipe 250 is embedded in the opening 234, the bottom portion 254 is partially bonded to the frame 230, and the pipy portion 252 is disposed in the opening 234. Additionally, the heat pipe 250 is a flat miniature heat pipe and has a thickness ranging between 0.25 mm and 1.00 mm. A working fluid 256 is disposed in a cavity C of the pipy portion 252, and a capillary structure 258 is disposed on a surface of the cavity C. The capillary structure 258 may be manufactured by a powder sintering or an etching process. In order to achieve a rust-resistance effect, besides pure water, an rust-resistant additive may be added in the working fluid 256 inside the cavity C, where a ratio of the pure water to the additive may range from 1:1 to 2:1, and the additive may be, for example, ethylene glycol, diethylene glycol, propylene glycol), nitrate, sulfate, tolytriazole, polytriazoleor mercapten benzenthiazole, which may be selected based on actual demands.

Figure 6:
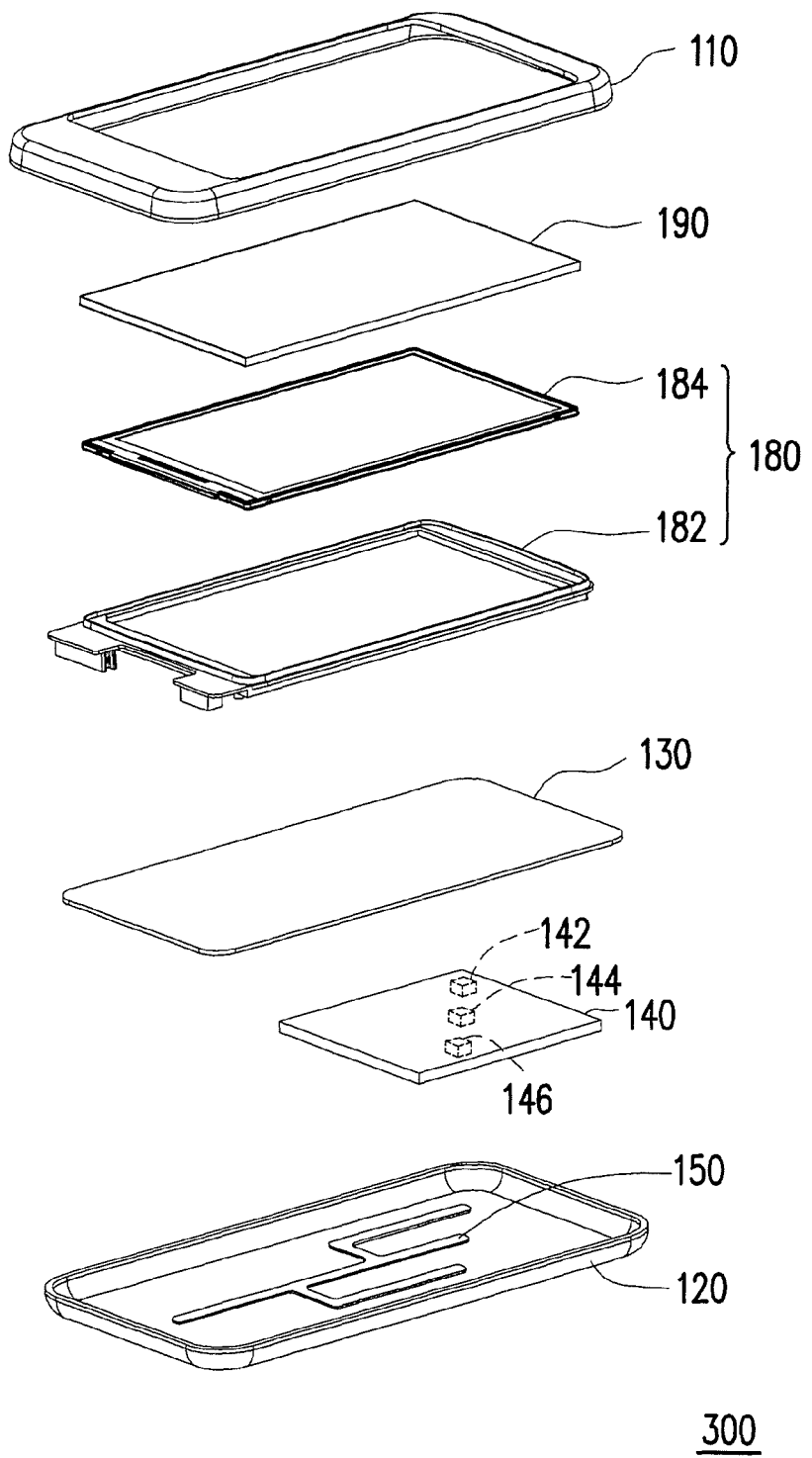
FIG. 6 is a schematic exploded diagram illustrating an electronic device according to another embodiment of the invention.

FIG. 6 is a schematic exploded diagram illustrating an electronic device according to another embodiment of the invention. Referring to FIG. 6, an electronic device 300 of the embodiment is similar to the electronic device 100 illustrated in FIG. 1, and only the difference between the present embodiment and the embodiment illustrated in FIG. 1 will be described, in which the same or similar elements are labelled by the same or similar reference numerals, and thus, will be repeated. In the present embodiment, the heat pipe 150 is disposed on the back cover 120 of the housing. The front cover 110 and the back cover 120 forms the housing of the electronic device 100, and a combination of the housing and the heat pipe 150 forms a heat dissipation plate of the present embodiment. An orthogonal projection of the heat pipe 150 overlaps the orthogonal projections of the first heat generating component 142, the second heat generating component 144 and the third heat generating component 146 on the surface of the back cover 120 in the similar way illustrated in FIG. 3. In other words, in the invention, the heat pipe 150 may be installed at the frame 130 illustrated in FIG. 1 or the back cover 120 illustrated in FIG. 6 according to the interior spatial arrangement of the electronic device. Furthermore, in an embodiment that is not illustrated, the back cover 120 may have an opening or a notch, and the heat pipe 150 is disposed in the opening or the notch.

Figure 7:
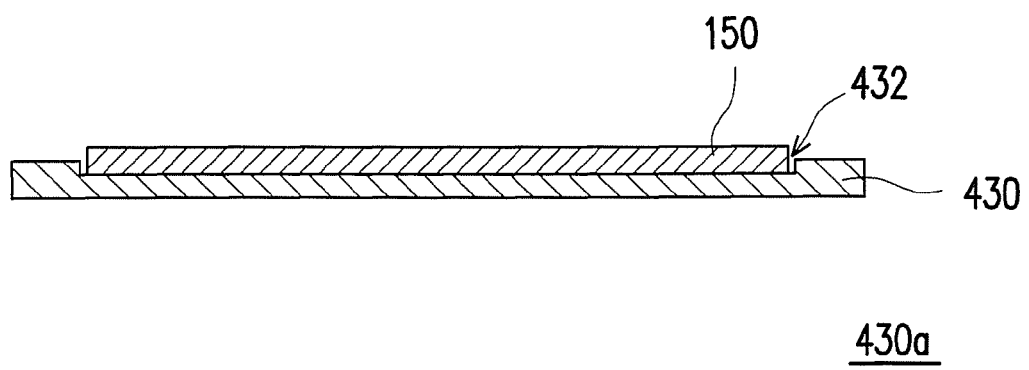
FIG. 7 is a schematic sectional diagram illustrating a heat dissipation plate according to another embodiment of the invention.

FIG. 7 is a schematic sectional diagram illustrating a heat dissipation plate according to another embodiment of the invention. Referring to FIG. 7, a heat dissipation plate 430a of the embodiment is similar to the heat dissipation plate 230a illustrated in FIG. 4 and only the difference between the present embodiment and the embodiment illustrated in FIG. 4 will be described, in which the same or similar elements are labelled by the same or similar reference numerals, and thus, will be repeated. In the present embodiment, a frame 430 has a notch 432, and through an adaptive manufacturing process, the heat pipe 150 may be embedded in the notch 432 of the frame 430. For instance, a thermal conductive adhesive or an adhesive of any other type is disposed on a back surface of the heat pipe 150, for example. The heat pipe 150 after being placed in the notch 432 is assembled to the frame 430 by using the back adhesive.

To summarize, in the electronic device and the heat dissipation plate of the invention, a position for installing the branched heat pipe is corresponding to positions of the heat generating components, and thus, the heat from the plurality of heat generating components can be dissipated through being guided to the low-temperature place by the heat pipe. Thereby, the electronic device can have a good dissipation effect. Moreover, when the frame has the opening or the notch, the heat pipe can be embedded in the opening or the notch to be bonded with the frame, the overall thickness after the frame is bonded to the heat pipe can be reduced. Therefore, the demand for thinning the electronic device can be satisfied. In addition, the branched heat pipe can save more spaces for the frame or the housing with higher strength, such that the electronic device can be maintained with sufficient structural strength.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electronic device, comprising:
a frame or a housing;
a first heat generating component;
a second heat generating component;
a heat pipe, installed at the frame or the housing, wherein the heat pipe has branches, and an orthogonal projection of the heat pipe on the frame or the housing at least partially overlaps orthogonal projections of the first heat generating component and second heat generating component on the frame or the housing; and
a circuit board, bonded to the frame or the housing, wherein the first heat generating component and the second heat generating component are disposed on the circuit board, the circuit board is located between the first heat generating component and the frame or the housing, and the circuit board is disposed between the second heat generating component and the frame or the housing,
wherein the frame or the housing has an opening or a notch, the heat pipe is embedded in the opening or the notch, the heat pipe comprises a bottom portion and a pipy portion on the bottom portion, the bottom portion is at least partially bonded to the frame or the housing, and the pipy portion is embedded in the opening or the notch.

2. The electronic device according to claim 1, further comprising a fixing plate bonding the heat pipe to the frame or the housing.

3. The electronic device according to claim 1, wherein the heat pipe is in a flat shape, and a thickness of the heat pipe ranges from 0.25 mm to 1.00 mm.

4. The electronic device according to claim 1, wherein the first heat generating component and the second heat generating component is selected from a CPU, a front lens image chip, a primary lens image chip, a charging chip, a power management chip and a radio frequency (RF) chip.

5. The electronic device according to claim 1, wherein the housing comprises a front cover and a back cover.

6. A heat dissipation plate, adaptive for a circuit board of an electronic device, wherein the circuit board has a first heat generating component and a second heat generating component, the heat dissipation plate comprising:
a frame, assembled to the circuit board and having an opening or a notch;
a heat pipe, installed at the frame and embedded in the opening or the notch, wherein the heat pipe has branches, and an orthogonal projection of the heat pipe on the frame at least partially overlaps orthogonal projections of the first heat generating component and second heat generating component on the frame, and
wherein the first heat generating component and the second heat generating component are disposed on the circuit board, the circuit board is located between the first heat generating component and the frame, and the circuit board is disposed between the second heat generating component and the frame,
wherein the heat pipe comprises a bottom portion and a pipy portion disposed on the bottom portion, the bottom portion is at least partially bonded to the frame, and the pipy portion is embedded in the opening or the notch.

7. The heat dissipation plate according to claim 6, further comprising a fixing plate, bonding the heat pipe to the frame.

8. The heat dissipation plate according to claim 6, wherein the heat pipe is in a flat shape, and a thickness of the heat pipe ranges from 0.25 mm to 1.00 mm.

9. A heat dissipation plate, adaptive for a circuit board of an electronic device, wherein the circuit board has a first heat generating component and a second heat generating component, the heat dissipation plate comprising:
a housing;
a heat pipe, installed on the housing, wherein the heat pipe has branches, and an orthogonal projection of the heat pipe on the housing at least partially overlaps orthogonal projections of the first heat generating component and second heat generating component on the housing, and
wherein the first heat generating component and the second heat generating component are disposed on the circuit board, the circuit board is located between the first heat generating component and the housing, and the circuit board is disposed between the second heat generating component and the housing, wherein the housing has a notch, and the heat pipe is embedded in the notch, the heat pipe comprises a bottom portion and a pipy portion disposed on the bottom portion, wherein the bottom portion is at least partially bonded to the housing, and the pipy portion is embedded in the notch.

10. The heat dissipation plate according to claim 9, further comprising a fixing plate, bonding the heat pipe to the housing.

11. The heat dissipation plate according to claim 9, wherein the heat pipe is in a flat shape, and a thickness of the heat pipe ranges from 0.25 mm to 1.00 mm.

* * * * *